United States Patent [19]

Malone

[11] 4,041,412
[45] Aug. 9, 1977

[54] HIGH POWER, PULSED MICROWAVE FREQUENCY CONVERTER

[75] Inventor: Hugh Robert Malone, Phoenix, Ariz.
[73] Assignee: Motorola, Inc., Schaumburg, Ill.
[21] Appl. No.: 695,698
[22] Filed: June 14, 1976
[51] Int. Cl.² ............................................. H03B 3/04
[52] U.S. Cl. ..................................... 331/10; 325/419; 330/20; 330/21; 331/17; 331/101; 331/177 V
[58] Field of Search ................... 331/10, 11, 9, 18, 17; 325/419, 420

[56] References Cited

U.S. PATENT DOCUMENTS

| | | | |
|---|---|---|---|
| 3,534,284 | 10/1970 | Beurrier | 331/10 |
| 3,882,413 | 5/1975 | Healey | 331/12 |
| 3,895,312 | 7/1975 | Tipon | 331/18 |

Primary Examiner—John Kominski
Attorney, Agent, or Firm—Eugene A. Parsons

[57] ABSTRACT

A high power, pulsed microwave frequency converter for a microwave communications system including a phase locked loop with a voltage controlled microwave oscillator that provides at least five watts of pulsed RF output power, the components of the loop being designed to lock on the desired RF output frequency within approximately 20 nanoseconds or during the initial portion of each pulse so that the converter coherently converts two low level signals, one or both of which may be pulsed, into a higher level narrow pulse signal at the sum or difference of the frequencies of the two low level signals.

5 Claims, 3 Drawing Figures

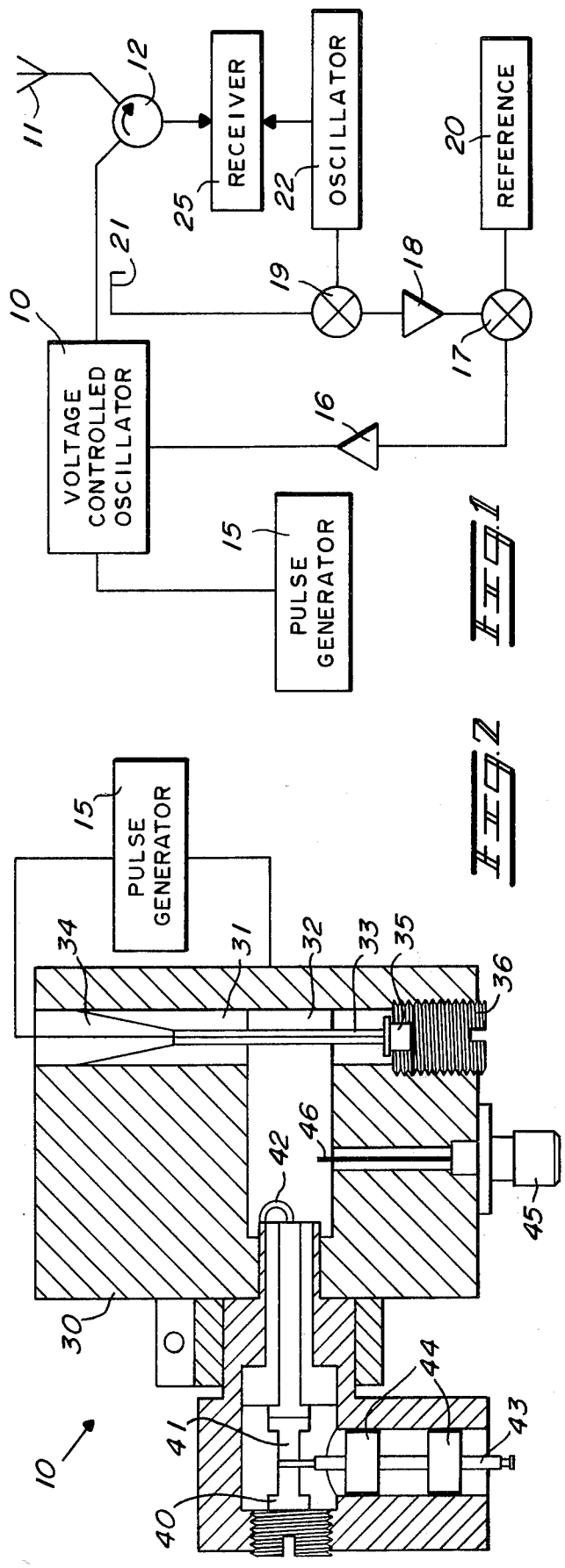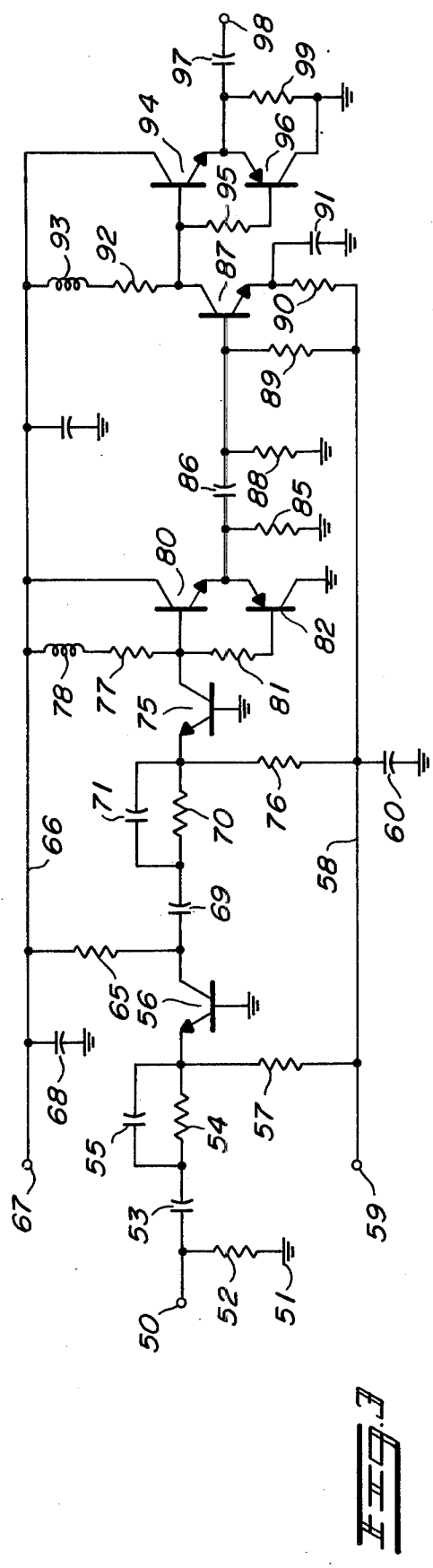

HIGH POWER, PULSED MICROWAVE FREQUENCY CONVERTER

BACKGROUND OF THE INVENTION

1. Field of the Invention

The present invention pertains to a high power, pulsed microwave frequency converter for use in a microwave communications system and/or radar systems. The high power converter is generally utilized in a transmitter for a communications system with a local oscillator and an intermediate frequency reference source controlling the output frequency. Typical microwave communications systems in which the present high power, pulsed microwave frequency converter finds application are missile guidance radar, offset frequency coherent transponders, ECM systems, coherent radar test sets, etc. wherein the systems require coherent pulsed transmitters.

2. Brief Description of the Prior Art

The conventional coherent solid state transmitter includes a series of oscillators injection locked from a reference signal that is on the order of one milliwatt. The typical gain per stage is 13 dB. For a transmitter with 10 watts of power this may mean as many as four injection locked oscillators in series. With this many oscillators in the circuit, problems such as temperature drift, power efficiency and reliability are greatly increased. Frequency conversion is obtained by using a low level single side band modulator to drive the series of injection locked oscillators.

There has been some work published on pulsed AFC loops where the time to lock is important, but these are not coherent systems. Further some prior art involved CW applications where the lockup time is of little or no significance. One such application may be found in U.S. Pat. No. 3,895,312, entitled "Low Noise High Spectral Purity Microwave Frequency Synthesizer", issued July 15, 1975. This patent relates to a microwave frequency synthesizer which uses a phase locked loop to perform a signal frequency conversion. This is not a pulse system and there is no teaching of operating this system with a narrow pulse. Further, there is no requirement or teaching that this system could replace the prior art injection locked series of oscillators to provide the high power required.

SUMMARY OF THE INVENTION

The present invention pertains to a high power, pulsed microwave frequency converter in a microwave communications system including the application of phase locked loop techniques to microwave circuits for coherently converting two low level signals, one or both of which may be pulsed, into a higher level narrow pulse signal at the sum or difference of the frequencies of the two low level signals, the loop including a wideband amplifier and wide tuning range voltage controlled microwave oscillator to provide lockup times on the order of 20 nanoseconds so that the oscillator can be made coherent during the initial part of each pulse, without using gain at the output frequency.

It is an object of the present invention to provide a new and improved high power, pulsed microwave frequency converter in a microwave communications system.

It is a further object of the present invention to provide a high power, pulsed microwave frequency converter utilizing a phase locked loop with a lockup time on the order of 20 nanoseconds so that a voltage controlled microwave oscillator in the loop can be made coherent during the initial part of each pulse, without using gain at the output frequency.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures:

FIG. 1 is a block diagram of a high power, pulsed microwave frequency converter embodying the present invention;

FIG. 2 is a sectional view of a voltage controlled microwave oscillator forming a portion of the system illustrated in FIG. 1; and FIG. 3 is a schematic diagram of a wideband amplifier forming a portion of the system illustrated in FIG. 1.

DESCRIPTION OF THE PREFERRED EMBODIMENT

Referring specifically to FIG. 1, a voltage controlled microwave oscillator 10 supplies a high power, pulsed microwave signal to an antenna 11 through a circulator 12. The voltage controlled oscillator 10 is a solid state microwave oscillator, to be described presently in conjunction with FIG. 2. The voltage controlled oscillator 10 has a bias input with a pulse generator 15 attached thereto for providing pulses of bias power to activate the oscillator 10. The voltage controlled oscillator 10 also has a control input which is connected to receive signals from a wideband amplifier 16 which includes a loop filter. An input of the wideband amplifier 16 is connected to an output of a phase detector 17, having a first input connected through an amplifier 18 to the output of a mixer 19 and a second input connected to an intermediate frequency reference source 20. The mixer 19 has a first input coupled to the output of the voltage controlled oscillator 10 by means of a loop 21 and a second input connected to the output of a local oscillator 22. The local oscillator 22 also supplies the output frequency thereof to a receiver 25. The input of the receiver 25 is connected to a second output of the circulator 12 so as to receive signals therefrom when the voltage controlled oscillator 10 is not applying pulses of RF signal thereto.

Referring specifically to FIG. 2, an embodiment of the voltage controlled microwave oscillator 10 is illustrated in detail. While a specific oscillator is illustrated in FIG. 2, it should be understood that many other innovations and embodiments may be devised by those skilled in the art and the present embodiment is illustrated because of its frequency and power characteristics. The oscillator 10 includes a housing 30 defining a first elongated cavity 31 therethrough and a second elongated cavity 32 perpendicular to the first cavity 31 and formed with mutual portions to provide coupling therebetween. An elongated center conductor 33 is fixedly mounted coaxially within the first cavity 31 by means of an RF load impedance 34 affixed to one end thereof and a negative resistance semiconductor device 35 which may be a transistor, IMPATT diode, GUNN-effect diode, tunnel diode or LSA diode, affixed to the other end thereof and mounted by means of a plug 36 threadedly engaged in the cavity 31. The cavity 31 and center conductor 33 form a coaxial line terminated with the negative resistance device 35 to provide microwave oscillations therein, in a manner well known to those skilled in the art. The cavity 32 is resonant at the desired frequency and is coupled to the cavity 31 to sustain oscillations of the desired frequency while out-of-band oscillations are terminated by the impedance 34.

To convert the fixed tuned oscillator into a voltage controlled oscillator, a pair of tuning diodes or varactors 40 and 41 are coupled into the cavity 32 by means of a coupling loop 42. The varacters add capacitance to the resonant cavity 32 to change the resonant frequency thereof. The coupling loop 42 is utilized because it provides a DC return for the diodes 40 and 41. The diodes 40 and 41 are connected to a control voltage input 43 so that the diodes are in parallel relative to a control voltage applied to the input 43 and are in series relative to RF voltage in the cavity 32. Thus, the breakdown voltage of the tuning diodes is increased so that the tuning range of the voltage controlled oscillator is increased. In the present embodiment the range of the tuning voltage is in excess of 40V and the tuning range is in excess of 100 MHz. A low pass filter 44 is incorporated in the structure in conjunction with the control voltage input 43 to reduce noise interference and the like. The filter 44 includes a pair of RF capacitors spaced one quarter wavelength apart and one quarter wavelength from the diodes 40 and 41 to isolate the Rf signals from the DC control voltage so that the diodes 40 and 41 can be properly biased by the control voltage without improperly terminating the RF signals.

An output probe 46 is in communication with the cavity 32 to remove power therefrom by way of a connector 45, which power is applied to the antenna 11 by way of the circulator 12. The pulses of bias power from the generator 15 are applied between the housing 30 and the center conductor 33 to bias the negative resistance diode 35 into the correct operation. When no bias is applied to the oscillator 10, no oscillations occur, since the negative resistance diode 35 is not operating in the proper mode. As pulses of bias are applied to the center conductor 33, the negative resistance diode 35 is biased into the proper mode and oscillations occur. In a coherent pulsed transmitter with a relatively narrow pulse width requirement, it is essential that the oscillator lock onto the desired output frequency during the initial portion of each pulse. Generaly a pulse which is less than approximately 250 nanoseconds is considered a relatively narrow pulse and the initial portion of this pulse is less than approximately 10% of the pulse duration. In the present embodiment the pulse width of the bias pulses, and the output RF pulses, are approximately 200 nanoseconds with an output RF frequency in the low Ku-band. Therefore, the oscillator 10 should lock onto the desired frequency within approximately 20 nanoseconds.

Referring to FIG. 3, a specific embodiment of the wideband amplifier 16 is illustrated. It should be understood that many other embodiments and variations of the wideband amplifier 16 mght be devised by those skilled in the art and the present amplifier is illustrated only for exemplarly purposes. An input terminal 50 is connected to ground 51 through a resistor 52. Signals on the input terminal 50 are coupled through a coupling capacitor 53 to one side of a parallel network including a resistor 54 and capacitor 55. The other side of the parallel network is connected to the emitter of an NPN type transistor 56, the base of which is connected to ground 51. The emitter is also connected through a resistor 57 to a voltage bus 58 adapted to have a negative voltage source (not shown) applied thereto by means of a terminal 59. A capacitor 60 is connected from the bus 58 to ground 51 to bypass any unwanted signals thereon. The collector of the transistor 56 is connected through a resistor 65 to a second voltage bus 66, which is adapted to have a positive voltage source (not shown) applied thereto by way of a terminal 67. A capacitor 68 is connected from the voltage bus 66 to the ground 51 to remove any unwanted signals thereform. The collector of the transistor 56 is also connected through a coupling capacitor 69 to one side a parallel network including a resistor 70 and a capacitor 71. The other side of the parallel network is connected to the emitter of an NPN type transistor 75 and through a resistor 76 to the negative voltage bus 58. The base of the transistor 75 is connected directly to ground 51 and the collector is connected through a series circuit including a resistor 77 and a coil 78 to the positive voltage bus 66. The collector of the transistor 75 is also connected directly to the base of an NPN type transistor 80 and through a resistor 81 to the base of a PNP type transistor 82. The collector of the transistor 80 is connected directly to the positive voltage bus 66 and the collector of the transistor 82 is connected directly to the ground 51. The emitters of the complimentary transistors 80 and 82 are connected together and through a resistor 85 to ground 51. The emitters are also connected through a coupling capacitor 86 to the base of an NPN type transistor 87. The base of the transistor 87 is also connected through a resistor 88 to ground 51 and through a resistor 89 to the negative voltage bus 58. The emitter of the transistor 87 is connected through a resistor 90 to the negative voltage bus 58 and through a capacitor 91 to ground 51. The collector of the transistor 87 is connected through a series circuit, including a resistor 92 and a coil 93, to the positive voltage bus 66. The collector of the transistor 87 is also connected directly to the base of an NPN type transistor 94 and, through a resistor 95, to the base of a PNP type transistor 96. The collector of the transistor 94 is connected directly to the positive voltage bus 66 and the collector of the transistor 96 is connected directly to ground 51. The emitters of the complimentary transistors 94 and 96 are connected together and through a capacitor 97 to an output terminal 98. A resistor 99 is connected from the emitter to the collector of the transistor 96.

Transistor 87 in the amplifier 16 is a high frequency transistor with a high voltage capability and it is incorporated into a common emitter amplifier. The emitter feedback resistor 90 is used to set the gan at a nominal value and capacitor 91 is placed in parallel therewith to increase the frequency response. In the present embodiment the bandwidth of the amplifier 16 is at least 100 MHz. The values of various components and the types of transistors in the schematic of FIG. 3 are listed below to aid in the understanding thereof.

| Transistors | Capacitors |
|---|---|
| 56, 75, 80, 87 and 94 - 2N5108 | 53 - 1 Mfd |
| 82, 96 - 2N2906 | 55 - 39 Pfd |
| | 60 - 1 Mfd |
| Resistors | 68 - 1 Mfd |
| | 69 - 1 Mfd |
| 52 - 47 ohms | 71 - 5 Pfd |
| 54 - 22 | 86 - 1 Mfd |
| 57 - 390 | 91 - 27 Pfd |
| 65 - 390 | 97 - 1 Mfd |
| 70 - 100 | |
| 76 - 390 | Coils |
| 77 - 1,000 | |

-continued

| | |
|---|---|
| 81 – 100 | 78 – 2.2 Mh |
| 85 – 1,500 | 93 – 1 Mh |
| 88 – 270 | |
| 89 – 220 | Voltages |
| 90 – 100 | |
| 92 – 510 | Buss 58 – –5 VDC |
| 95 – 100 | Buss 66 – +25 VDC |
| 99 – 1,500 | |

In the high power, pulsed microwave frequency converter illustrated, the voltage controlled microwave oscillator 10 supplies the required output power and it is necessary to use a phase locked loop to lock the oscillator 10 to a reference source so that the oscillator 10 will be coherent. For this to be a viable solution the oscillator 10 must be coherent over a high percentage of each pulse. For example, if the pulses are 200 nanosecond duration, the time to obtain coherence should be less than approximately 20 nanoseconds. Through extensive testing and analysis it has been determined that the lockup time for the phase locked loop is dependent upon the bandwidth of the amplifier 16 and the tuning range of the oscillator 10. The tuning range of the oscillator 10 may be limited by the output voltage of the amplifier 16 and therefor this output voltage also limits loop performance. It has been determined, through testing and analysis, that the oscillator 10 must have a minimum tining range of approximately 60 MHz with 5 watts peak power output. Also, the bandwidth of the amplifier 16 must be approximately 100 MHz with a gain of 30db and 10 volts peak to peak voltage output. By providing components with these required minimum characteristics the oscillator 10 can be made coherent over a high percentage of each pulse, generally within 20 nanoseconds, and the converter described can provide the required power output with much less complexity than the prior art. All of the gain in the prior art systems is provided at the microwave frequencies, whereas, in the present invention all of the gain is provided at IF or control voltage (video) frequencies. The lockup time of the phase loop enables the system to be coherent to different signals for each different pulse. Thus, a much simpler high power, pulsed microwave frequency converter is disclosed wherein the problems of temperature drift, power efficiency and reliability are greatly reduced, if not eliminated.

I claim:

1. In a microwave communications system, a high power, pulsed microwave frequency converter comprising:
   a. a voltage controlled microwave oscillator having a bias input, a control input and an output, and supplying microwave frequency signals at the output only when a proper bias is applied to the bias input thereof;
   b. bias pulse generating means providing periodic pulses of bias power connected to the bias input of said voltage controlled microwave oscillator each of said bias pulses having a duration of less than approximately 250 nanoseconds;
   c. a mixer having a first input coupled to the output of said voltage controlled microwave oscillator, a second input and an output;
   d. local oscillator means having an output connected to the second input of said mixer;
   e. a phase detector having a first input coupled to the output of said mixer, a second input and an output;
   f. an intermediate frequency reference source having an output connected to the second input of said phase detector;
   g. a wideband amplifier having an input coupled to the output of said phase detector and an output coupled to the control input of said voltage controlled microwave oscillator; and
   h. said voltage controlled microwave oscillator and said wideband amplifier having means therein for providing sufficient tuning range and bandwidth, respectively, to cause the converter to lock onto a desired microwave frequency within a period shorter in duration than approximately ten percent of the bias pulse duration.

2. A high power, pulsed microwave frequency converter as claimed in claim 1 wherein the time within which the converter locks onto a desired microwave frequency is less than approximately 20 nanoseconds.

3. A high power, pulsed microwave frequency converter as claimed in claim 2 wherein the tuning range of the voltage controlled microwave oscillator is greater than approximately 60 MHz.

4. A high power, pulsed microwave frequency converter as claimed in claim 2 wherein the bandwidth of the wideband amplifier is greater than approximately 100 MHz.

5. A high power, pulsed microwave frequency converter as claimed in claim 2 wherein the voltage controlled microwave oscillator is capable of providing approximately 5 watts of peak power.

* * * * *